United States Patent [19]
Hillendahl et al.

[11] Patent Number: 5,171,411
[45] Date of Patent: Dec. 15, 1992

[54] ROTATING CYLINDRICAL MAGNETRON STRUCTURE WITH SELF SUPPORTING ZINC ALLOY TARGET

[75] Inventors: James W. Hillendahl, Vacaville; J. Glen Palmer, Concord, both of Calif.

[73] Assignee: The BOC Group, Inc., New Providence, N.J.

[21] Appl. No.: 703,663

[22] Filed: May 21, 1991

[51] Int. Cl.$^5$ ............................................. C23C 14/35
[52] U.S. Cl. .......................... 204/192.12; 204/192.15; 204/192.29; 204/298.12; 204/298.13; 204/298.22
[58] Field of Search ...................... 204/192.12, 192.15, 204/192.22, 192.26, 192.27, 192.28, 192.29, 298.12, 298.13, 298.21, 298.22

[56] References Cited

U.S. PATENT DOCUMENTS

| | | | |
|---|---|---|---|
| 3,978,272 | 8/1976 | Donley | 428/434 |
| 4,022,947 | 5/1977 | Grubb et al. | 428/432 |
| 4,466,940 | 8/1984 | Siewert et al. | 420/507 |
| 4,548,691 | 10/1985 | Dietrich et al. | 204/192.27 |
| 4,610,771 | 9/1986 | Gillery | 204/192.1 |
| 4,769,291 | 9/1988 | Belkind et al. | 428/630 |
| 4,806,221 | 2/1989 | Gillery | 204/192.29 |
| 5,047,131 | 9/1991 | Wolfe et al. | 204/192.23 |

FOREIGN PATENT DOCUMENTS

| | | | |
|---|---|---|---|
| 0412810A1 | 2/1991 | European Pat. Off. | 204/298.13 |
| 3639508A1 | 5/1987 | Fed. Rep. of Germany | 204/192.29 |
| 63-175304 | 7/1988 | Japan | 204/298.13 |

OTHER PUBLICATIONS

"ZA®-12 Bearing Stock" pamphlet published by Cominco Metals, a division of Cominco Ltd., Toronto, Canada.

Primary Examiner—Aaron Weisstuch
Attorney, Agent, or Firm—David A. Draegert; Larry R. Cassett

[57] ABSTRACT

Alloys useful for preparing self-supporting cylindrical targets are provided. The alloys comprise zinc and one or more other metals chosen from the following: aluminum, bismuth, cerium, gadolinium, hafnium, niobium, silicon, tantalum, titanium, vanadium, yttrium, and zirconium. In one preferred embodiment, a zinc alloy with approximately 2% aluminum forms self-supporting cylindrical targets from which metal oxide films are prepared by reactive sputtering. The alloy oxide films are clear, transparent, non-absorbing, and optically functional.

14 Claims, 9 Drawing Sheets

ROTATING CYLINDRICAL MAGNETRON STRUCTURE WITH SELF SUPPORTING ZINC ALLOY TARGET

FIELD OF THE INVENTION

This invention is related generally to the coating of substrate articles by sputtering, and more particularly, to improved structural features of a rotating cylindrical magnetron used for such coating operations.

BACKGROUND OF THE INVENTION

The coating of large area substrates, such as architectural glass, automobile windshields and the like, has been accomplished for some time by a sputtering process that includes the use of a planar magnetron. Such coatings include multilayer solar control coatings that are widely used on commercial building windows. Typical multilayer solar control coatings comprise metal-dielectric film stacks of three, five, or seven layers which can be used for low emissivity, heat mirror (solar control), or heated (defroster) applications. Zinc oxide, tin oxide, indium oxide, or mixtures thereof are common dielectric materials used in such films. See Gillery, U.S. Pat. No. 4,806,221, issued Feb. 21, 1989; Belkind et al., U.S. Pat. No. 4,769,291, issued Sep. 6, 1988; Gillery, U.S. Pat. No. 4,610,771; issued Sep. 9, 1986; Dietrich et al., U.S. Pat. No. 4,548,691, issued Oct. 22, 1985; Siewert et al., U.S. Pat. No. 4,466,940, issued Aug. 21, 1984; Grubb et al., U.S. Pat. No. 4,022,947, issued May 10, 1977; and Donley, U.S. Pat. No. 3,978,272, issued Aug. 31, 1976.

More recently, rotating cylindrical magnetrons have been employed for depositing the dielectric layers. In some rotating cylindrical magnetrons the cathode target assembly is in the form of a elongated, solid tube manufactured from target material. However, hitherto self-supporting solid targets can only be manufactured from relatively hard metals or alloys with high melting points such as stainless steel, copper, and titanium. In other cylindrical magnetrons, the target assembly comprises a non-magnetic support tube that carries a layer of target material applied to its outer surface that is to be sputtered. Plasma and liquid metal spray techniques are often employed to apply the target material onto the support tube. In some other cases, metal target material is cast on a stainless steel support. For metallic target materials, the metal ions sputtered therefrom can react with reactive gases such as oxygen to form a metal oxide that is deposited onto a particular substrate. However, cathode targets so fabricated are often inefficient and inadequate. One problem is that poor bonding between the support tube and the target material leads to poor thermal contact and inadequate cooling. Moreover, differences in thermal expansion between the support and target materials also contribute to target deterioration. These problems are particularly acute for soft target materials like zinc.

SUMMARY OF THE INVENTION

It is a primary object of the present invention to provide an improved rotating cylindrical magnetron structure that is capable of prolonged large-scale industrial sputtering applications.

It is also an object of the present invention to provide an improved rotating cylindrical magnetron structure wherein the target material is self-supporting.

It is a further object of the present invention to provide a rotating cylindrical magnetron structure especially adapted for sputtering dielectric and metal films.

These and additional objects are accomplished by various structural techniques and features of the present invention which may be employed individually or in combination.

The present invention is based in part on the discovery that certain zinc based alloys can be used to fabricate self-supporting cylindrical targets. The inventive alloys comprise zinc and one or more of the following twelve elements: aluminum, bismuth, cerium, gadolinium, hafnium, niobium, silicon, tantalum, titanium, vanadium, yttrium, and zirconium. Moreover, the addition of any of these twelve metals to the base metal does not adversely affect the mechanical or optical properties of the alloy oxide films that are produced by reactive sputtering with these self-supporting targets. In one preferred embodiment, a zinc alloy comprising approximately 2% by weight of aluminum is used to make self-supporting cylindrical targets from which clear, transparent, non-absorbing, and optically functioning films are produced. Such films can be used in multilayered solar control coatings.

Additional objects, advantages and features of the various aspects of the present invention will become apparent from the following detailed description of its preferred embodiments, which description should be taken in conjunction with the accompanying drawings.

DESCRIPTION OF THE PREFERRED EMBODIMENTS

The invention is based in part on the discovery that the addition of a small amount of aluminum to zinc forms an alloy that can be used to fabricate self-supporting cylindrical magnetron targets. Making the tube self-supporting obviates the need for a support tube. Moreover, the addition of aluminum to zinc has no detrimental effect on the properties of the oxide film formed in reactive sputtering. Specifically, clear, transparent, non-absorbing, and optically functional films, that is, films of sufficient reflective and transmissive properties, can be prepared. These metal oxides can be used in multilayer solar control coatings with only minor modifications to the thickness of the dielectric layers. In addition, adhesion, abrasion resistance, and environmental resistance, e.g., corrosion properties of the coatings, may be enhanced.

Figure 1:
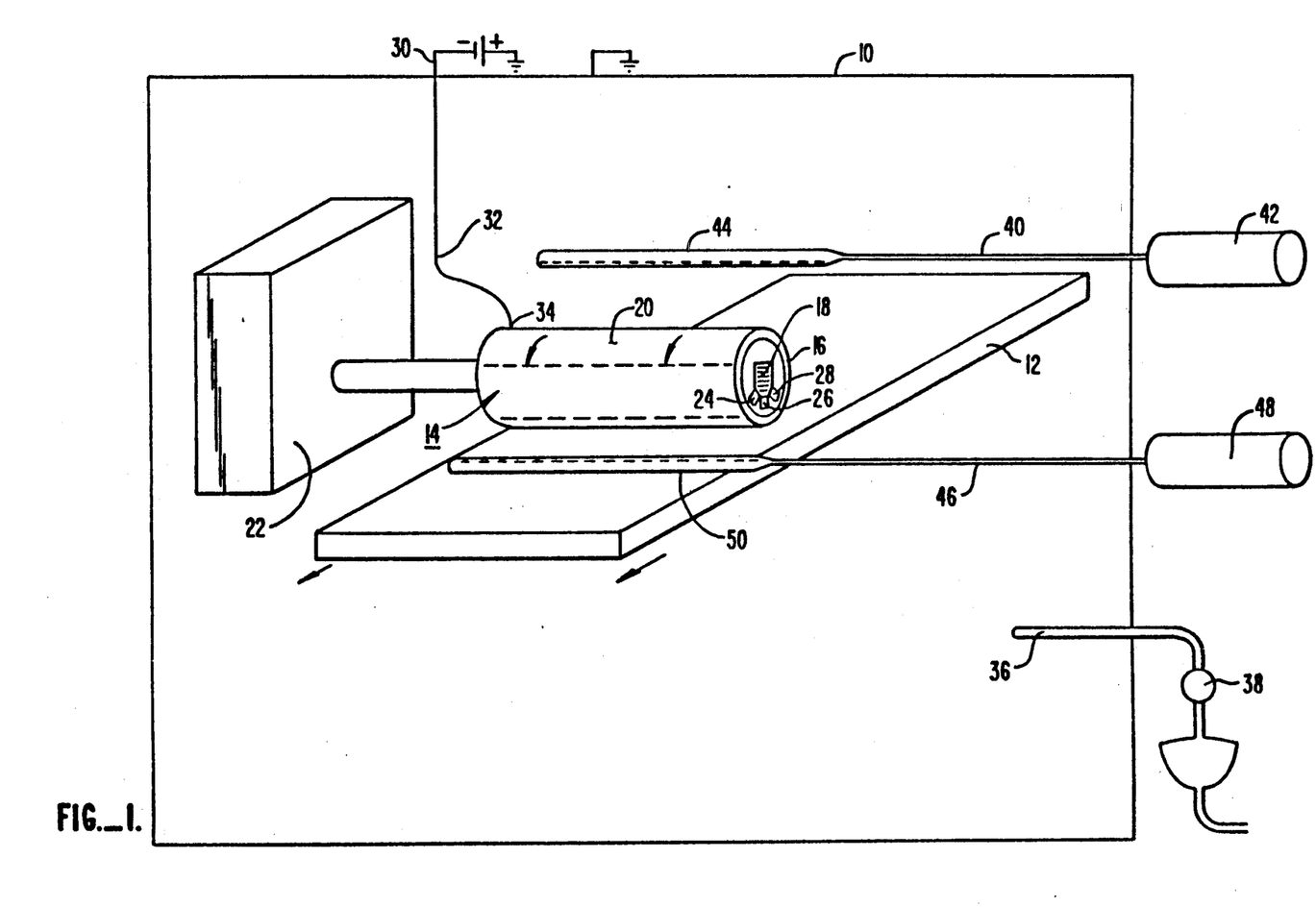
FIG. 1 is a schematic representation of a rotating cylindrical magnetron sputtering system of a type in which the present invention is advantageously utilized.

Referring initially to FIG. 1, a sputtering system is generally described of a type wherein the improvements of the present invention are utilized. A plasma is formed within an enclosed reaction chamber 10, in which a vacuum is maintained, for the purpose of depositing a thin film of material on a substrate 12 as it moves through the chamber 10. The substrate 12 can be most anything that will accept the film to be deposited on it, and is usually some vacuum compatible material, such as metal, glass, and some plastics. The film can also be deposited over other films or coatings that have previously been formed on a substrate surface.

A cathode assembly 14 comprises generally an elongated rotatable cylindrical tube 16, mounted in the reaction chamber 10, and having a target surface 20. An elongated magnet assembly 18 is carried within a lower portion of the tube 16 and does not rotate with it. The inside of the tube 16 is typically water cooled in order to allow the system to operate at high electrical power levels. The tube 16 is supported in a horizontal position and is rotated by a drive system 22 at a constant speed about its longitudinal axis. The tube 16 has walls made of target material described below.

The elongated magnet 18 comprises an assembly arranged lengthwise within the tube 16. The assembly is designed to result in three alternating magnetic poles 24, 26 and 28 around the circumference of the cylinder that are maintained at the bottom of the rotating cylindrical target 14. The arrangement illustrated in FIG. 1 is a "W" configuration of magnets, in cross-section. An alternative arrangement, described later, is a "U" shaped cross-sectional configuration. In either case, the magnets are positioned in relation to the tube 16 so that the their lines of force run from one pole, through the tube, and back through the tube in a curve to an adjacent pole. This arrangement generates what is called a "magnetic tunnel" between adjacent poles, which not only allows the sputtering rate to be increased, but also causes the target material 20 to be removed faster inside the tunnel, especially in the middle.

A cathode potential sufficient to cause sputtering to occur is supplied to the tubular target 20 from a power source 30 through a power line 32 having sliding contact 34 with the tube 16 by a conventional electrical brush. The power source 30 is of a direct current type in the example being described but alternating current power sources can also be used in such structures. The enclosure of the reaction chamber 10 is conductive and electrically grounded. It serves as an anode in the sputtering process. A separate anode may be optionally employed and maintained at a small positive voltage. In order to obtain the low pressure necessary for the coating operation to be performed, the reaction chamber 10 is provided with an outlet tube 36 communicating with a vacuum pump 38.

In order to provide the chamber 10 with the gases necessary for the coating operation, a gas supply system is included. A first gas supply tube 40 extends into the coating chamber 10 from a source 42 of an inert gas. Nozzles 44 connected to inlet tube 40 distribute the inert gas in a region above the rotating cathode 14. It is the inert gas that breaks down into electrically charged ions under the influence of an electric field established between the target surface 20 and the grounded chamber enclosure. The positive ions are attracted to and bombard the target surface 20 in an area to which they are guided by the magnetic field, primarily in two parallel strips, one between each of the opposing magnetic poles, along the length of the cylinder 14 at its bottom, opposite the magnet assembly 18.

A second gas supply tube 46 extends into the chamber 10 from a reactive gas source 48. Nozzles 50 connected to inlet tube 46 distribute the reactant gas in a region close to and across the width of the substrate 12 being coated. Molecules of the reactive gas combine with molecules sputtered from the target surface, as a result of ion bombardment, to form the desired molecules that are deposited on the top surface of the substrate 12.

Many variations in the gas supply system shown are practical as well. The inert and reactive gases from the sources 42 and 48 can be combined and delivered into the chamber 10 through a common tube and set of nozzles. When this is done, the delivery tube is preferably positioned along a side of the rotating target tube 16 and parallel with its longitudinal axis. Two such tubes can be used, one on each side of the target tube 16 and parallel with its longitudinal axis, each delivering the same combination of inert and reactive gases. Also, more than one reactive gas can be simultaneously supplied, depending upon the film being deposited.

Figure 2:
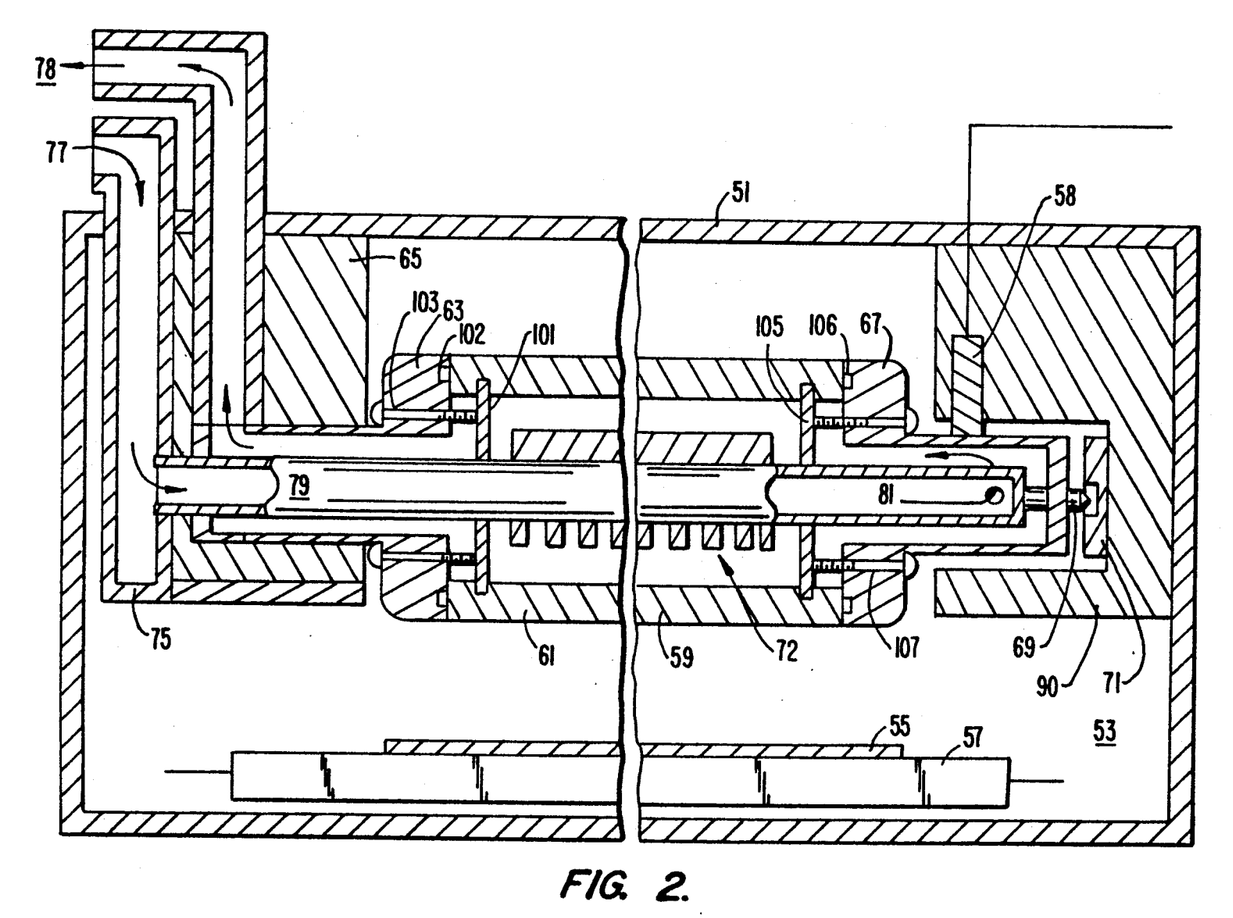
FIG. 2 shows a cross-sectional view through the middle of a cylindrical sputtering target of a type used in the system of FIG. 1.

Referring to FIG. 2, a cross-sectional view of a preferred rotating cylindrical target structure, and some associated elements, are shown. The assembly of FIG. 2 is preferred for utilization in the sputtering system generally illustrated in the overall schematic representation of FIG. 1. An electrically grounded metal frame 51 forms a vacuum chamber 53 within it. Ambient room temperature and pressure exist on the outside of the encasing walls 51. A substrate 55 that is being coated, such as a sheet of glass, is advanced past the rotating cylindrical magnetron structure, in a direction perpendicular to the plane of the paper, by a plurality of supporting rollers, such as the roller 57.

A cylinder 59 entirely formed from the desired target material includes surface 61. The cylinder 59 is attached to spindle shaft 63 that is supported by a support assembly 65. Similarly, the other end of the cylinder 59 is supported by spindle shaft 67 that is supported by trunnion 69 received in bracket 71 that is secured to support assembly 90. Both spindles can be made of stainless steel. The support assembly and bracket together hold the cylindrical target 59 in a desired rotatable position, rotate it about its longitudinal central axis, provide a source of cooling fluid and exhaust the warm fluid from it, and provide an electrical connection of it to a large d.c. voltage, via brush assembly 58.

An end plate 75 carries water from a source (not shown) through an opening 77. An elongated tube 79 is fixed with a wall of the conduit member 75 in a manner that its central axis is coincident with that of the rotating cylinder 59. The purpose of the tube 79 is to carry water through the cylinder 59 to its opposite end, where it is allowed to exit through an opening 81. Water escaping that end of the tube passes back through an interior of the cylinder 59, thereby cooling the target surface, and exits through conduit 78.

Cylinder 59 is attached at one end to half-moon clamp 101 with appropriate static-o-ring seals 102 situated therein between. The half-moon clamp in turn is connected to spindle 63 by screws 103 in such fashion so as to provide good electrical contact between the spindle and cylinder. In this embodiment, an electrical brush is in contact with spindle 67. Similarly, at the other end of the target, cylinder 59 is attached to half-moon clamp 105 with appropriate static-o-ring seals 106 situated therein between. The half-moon clamp is connected to spindle 67 by screws 107.

The structure being described can be utilized for sputtering with alternating current or direct current. Both are utilized for different applications but the direct current embodiment is usually preferred for industrial applications where deposition rate of a film on a substrate is desired to be maximized. For many applications, a single rotating cylindrical target is satisfactory. However, for high deposition rate, large-scale commercial coating systems, it is often desirable to position two or more such target assemblies in tandem, close together.

If a single rotating cylindrical magnetron assembly is utilized in a given installation, it does not matter what relative positions of the north and south poles of the magnetic assembly 72 take. But if two or more target assemblies are utilized adjacent each other, it has been found preferable to have alternating polarity orientations of adjacent units. One of the adjacent target assemblies has its polarity arranged in a north-south-north sequence while the adjacent one has a south-north-south arrangement. The different polarity arrangements are provided by simply rotating the magnet one hundred eighty degrees about their longitudinal axis. This has been found to desirably control the position and shape of the resulting plasma near the surface of the substrate 55 that is being coated.

The addition of small amounts of aluminum to zinc form alloys from which self-supporting cylindrical targets can be fabricated. The aluminum acts as a grain refiner in the cast zinc alloy. The fine grain structure contributes to the alloy's overall strength even at elevated temperatures. In one embodiment, the inventive zinc alloys comprise approximately 1 to 7% aluminum by weight. Experiments show that zinc alloy targets containing below approximately 1% aluminum tend to sag. In a preferred embodiment, the inventive zinc alloy comprises approximately 2% aluminum by weight. The targets of this embodiment maintain excellent structural integrity and produce high quality metal oxide films. Self-supporting cylindrical cathodes can also be formed from zinc based alloys that contain approximately 1 to 7% by weight of one or more of the following twelve elements: aluminum, bismuth, cerium, gadolinium, hafnium, niobium, silicon, tantalum, titanium, vanadium, yttrium, and zirconium. Targets of such alloys can be used to reactively sputter visibly transparent metal oxide films or to sputter opaque metal films.

Experimental Results

Experiments utilizing the inventive device and method were conducted in a cylindrical magnetron manufactured by Airco Coating Technology, a division of the Assignee. Five zinc alloy solid tube self-supporting targets were tested. The alloys comprised zinc and aluminum in the following amounts of aluminum (by weight): 1%, 2%, 4%, 8%, and 12%. In addition, small amounts of copper and magnesium were added to promote machinability; the amount of copper and magnesium together was less than 1% by weight. These targets were manufactured by Cominco Metals, Ontario, Canada employing a continuous casting process; the 12% and 8% aluminum alloys are sold under the trade names ZA-12 TM and ZA-8 TM, respectively; and the 4% aluminum alloy is known as 4% Al ZAMAK3 TM. All ZAMAK3 TM alloys are 4% weight aluminum, with varying amounts of copper and magnesium added for various casting operations. The copper and magnesium in zinc cast alloy is believed to inhibit the formation of the alpha-prime phase during the solidification process. Alpha-prime is an undesirable aluminum-rich phase in the alloy. These minor alloy additions did not affect the target's performance. For convenience, the 4% aluminum ZAMAK3 TM, ZA-8 TM, and ZA-12 TM targets will be referred hereinafter simply by their aluminum content, e.g., 4% Al.

Prior to sputtering, the targets were conditioned using an inert gas, then the process gas was added until the desired partial pressure was reached. The process was operated at that point until stabilized. Glass substrates were then introduced to the coat zone and the film was applied. The method according to the invention provides durable metal based compound coatings which are deposited at high rates.

Figure 3:
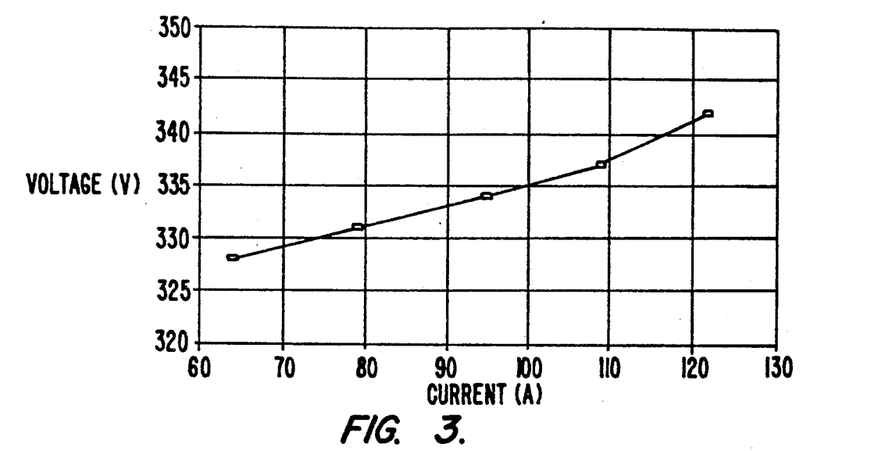
FIG. 3 is a graph of current versus voltage for an inventive target.
Figure 4:
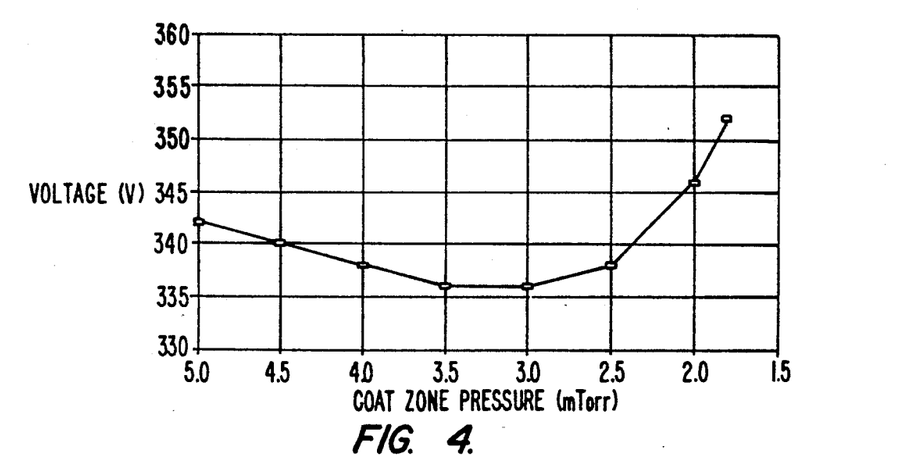
FIG. 4 is a graph of pressure versus voltage for an inventive target.

Table 1 sets forth the process data in the production of five film samples from the 4% Al target. For each sample, the substrate passed through the plasma during the sputtering process six times at a speed of 50 inches per minute. Prior to reactive sputtering, the target was tested for current-voltage and pressure-voltage responses; the targets demonstrated normal responses as shown in FIGS. 3 and 4.

TABLE 1

| Sample | Film Thickness (Å) | DDR (Åmm²/J) | Power (kW) | Voltage (Volt) | Current (Amp) | Pressure (mTorr) | O₂/Ar Gas Flow (sccm) |
|---|---|---|---|---|---|---|---|
| 1 | 1872 | 990 | 20 | 328 | 64 | 2.56 | 219/34 |
| 2 | 2434 | 859 | 30 | 334 | 95 | 2.54 | 219/34 |
| 3 | 2035 | 808 | 40 | 340 | 124 | 2.36 | 218/33 |
| 4 | 3602 | 763 | 50 | 340 | 155 | 2.50 | 290/0 |
| 5 | 3938 | 706 | 59 | 346 | 167 | 2.53 | 302/0 |

The deposition rates for the production of the zinc alloy oxides utilizing the inventive method were measured as follows. First, the physical thickness of the films was measured using a Sloan Dektak IIA Profilometer. The films were produced by depositing over lines drawn by a permanent marker followed by delaminating the film over the line in an ultrasonic alcohol bath. Then the sputter efficiency, or dynamic deposition rate (DDR), was calculated for each film using the physical thickness and deposition parameters in the equation given by Waits (see R. K. Waits, Thin Film Processes, page 150, Academic Press, N.Y., 1978):

$$DDR(\mathring{A}MM^2/Joule) = (d*C*S)/(P*n)$$

Where:
d = Thickness of the film in angstroms
C = Racetrack length of the target in mm
S = Conveyer speed in mm per second
P = Power applied in watts
n = Number of passes.

Argon was eliminated for the last two data points since the target tended to go metallic at higher powers. This is estimated to decrease the dynamic rate by approximately 10% based on test results using other zinc alloys.

Figure 5:
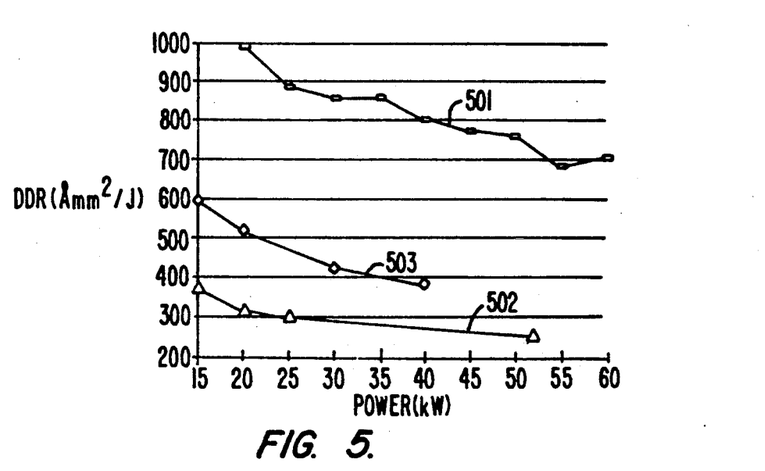
FIG. 5 is a graph of dynamic deposition rate versus power for different targets.

FIG. 5 is a graph of DDR versus power for the 4%, 8%, and 12% Al targets. The rate at 59 kW for the 4% Al target (curve 501) in pure oxygen was 706 DDR, a reasonably high rate. The DDR for 4% Al is much higher at all powers than that for 12% Al (curve 502) and 8% Al (curve 503), and compares favorably with the rate for a pure zinc planar target, which was measured at 1316 DDR at a maximum allowable power of 20.6 kW in oxygen with 10% argon.

Figure 6:
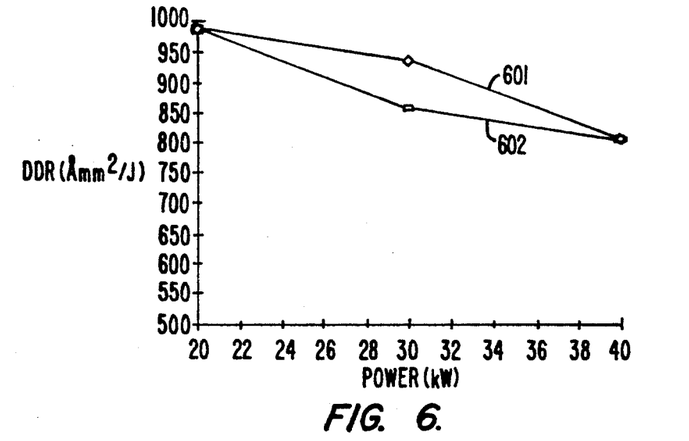
FIG. 6 is a graph of dynamic deposition rate versus power for an inventive target.
Figure 7:
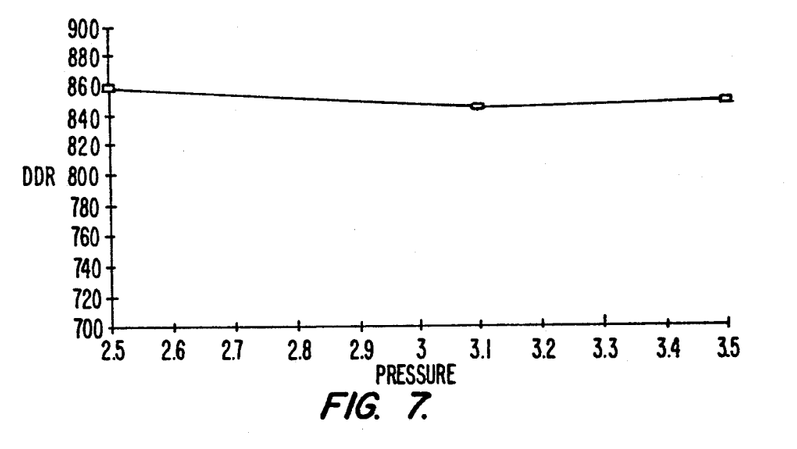
FIG. 7 is a graph of dynamic deposition rate versus coat zone pressure for an inventive cathode.
Figure 8:
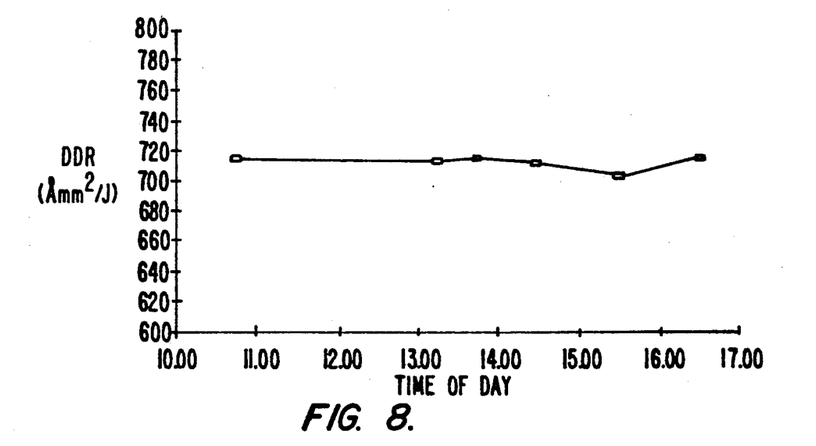
FIG. 8 is a graph of dynamic deposition rate versus time of day for an inventive target.

As is apparent from FIG. 5, the DDR decreased as the power increased, a common phenomenon for cylindrical targets. In contrast, the DDR for a comparable size zinc planar target does not vary with power up to the melting point of about 25 kW. FIG. 6, which is a graph of DDR versus power for the 4% Al target, shows that the decrease in DDR for the targets is an inherent phenomenon, and is not a time dependent effect. The DDR tracks itself with increasing (curve 601) and decreasing (curve 602) power. Variations in DDR are due to thickness measurement error using the Sloan Dektak Profilometer and due to fluctuations in operating conditions during different times of the day. FIGS. 7 and 8 show the DDR as a function of system pressure and as a function of time with constant operating parameters, respectively, for the 4% Al target. Neither pressure nor time of day appears to be a significant factor over the ranges examined. FIG. 8 clearly shows long term stable operation at high power density (6 hours at 59 kW).

Figure 9:
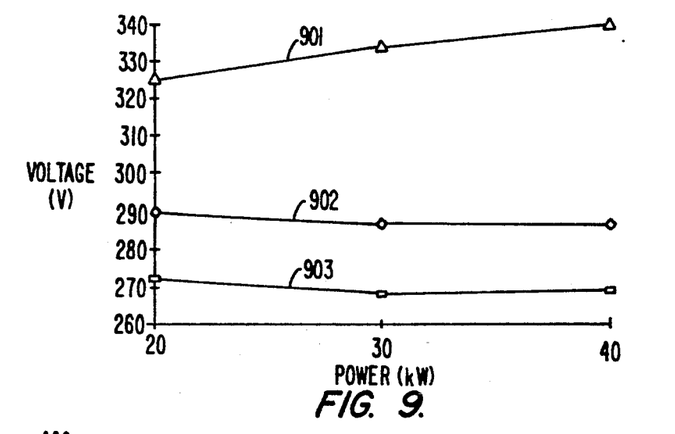
FIG. 9 is graph of voltage versus power for different targets.

The operating voltage also presented an important trend, as shown in FIG. 9 which is a graph of voltage versus power for the 4%, 8%, and 12% Al targets. For powers of 20, 30, and 40 kW, the voltage is nearly constant for the three zinc alloy targets tested, but the magnitudes were different. At 20 kW, for instance, the voltages were 480 V, 328 V, and 290 V, and 272 V for pure zinc (not shown), 4% Al (curve 901), 8% Al (curve 902), and 12% Al (curve 903), respectively, in oxygen with 10% argon. All of the alloys are well below the pure zinc planar target voltage. This may be due to higher secondary electron emission of $Al_2O_3$ that puts more electrons into the plasma, which results in more efficient ionization and thus lower impedance and lower operating voltage. As is apparent, the operating voltage decreases as the aluminum content increases. This is very significant in terms of operation, since at low operating voltage, the power supplies reach their current limit quickly, limiting achievable powers. The operating voltage should not be a problem for zinc targets containing 4% aluminum or less.

Metal-dielectric film stacks wherein the dielectric layer comprised of zinc alloy oxide films reactively sputtered from a 4% Al target were prepared. The neutral low-emissivity stacks had the following general design structure: glass/dielectric/ Ag/dielectric. The film stacks had the following optical and electrical specifications:

| Illuminant D65, 10 degree observer | | |
|---|---|---|
| % T = 88.6 | Rf = 4.3 | Rg = 4.9 |
|  | a = 0.05 | a = −0.4 |
|  | b = −4.2 | b = −7.1 |

As a comparison, a neutral low-emissivity commercially available filter, where the dielectric layer in the above design structure comprise $ZnO_2$, normally has the following optical and electrical specifications.

| Illuminant D65, 10 degree observer | | |
|---|---|---|
| % T = 86 ± 3 | Rf = 6 ± 3 | Rg = 6 ± 3 |
|  | a = −1.5 ± 2 | a = −1.5 ± 2 |
|  | b = −4.0 ± 2 | b = −6.0 ± 2 |

Finally, the following optical and electrical specifications were measured from a neutral lowemissivity filter of similar design structure wherein the dielectric layer consisted of zinc oxides formed by reactive sputtering on a planar magnetron with a zinc target.

| Illuminant D65, 10 degree observer | | |
|---|---|---|
| % T = 85.6 | Rf = 4.3 | Rg = 5.7 |
|  | a = −0.5 | a = −1.3 |
|  | b = −5.6 | b = −7.4 |

As is apparent, low-emissivity filters wherein the dielectric comprises oxides reactively sputtered from 4% Al produced filters that are comparable to filters wherein the dielectrics are formed from essentially pure zinc oxides.

Fabrication of Targets

Two 84-inch targets, each comprising approximately 1% aluminum, were fabricated by the continuous casting method. The targets were positioned on lathes overnight. It was found that the targets sagged approximately 0.008 to 0.010 inches overnight. It was apparent that the 1% aluminum alloy did not have sufficient strength for application in self-supporting rotatable targets.

Table 2 shows the results of chemical analyses of various zinc alloy targets for the major alloying elements (Al, Cu, and Mg) and normally specified impurities (Fe, Pb, Cd, and Sn), which are usually found in "pure" zinc or zinc alloys.

TABLE 2

| Alloy | Cast | Percent by Weight | | | | | | |
|---|---|---|---|---|---|---|---|---|
| | | Al | Cu | Mg | Fe | Pb | Cd | Sn |
| 2% Al | Gravity | 1.95 | 0.100 | 0.030 | 0.003 | 0.004 | 0.0006 | <0.005 |
| 2% Al | Continuous | 2.02 | 0.104 | 0.031 | 0.002 | 0.004 | 0.0006 | <0.005 |
| 4% Al | Continuous | 4.10 | <0.05 | 0.039 | 0.013 | 0.002 | <0.002 | <0.002 |
| 4% Al | Continuous | 4.15 | <0.05 | 0.038 | 0.012 | 0.002 | <0.0001 | <0.002 |
| 8% Al | Continuous | 8.46 | 1.01 | 0.023 | 0.009 | 0.004 | 0.0004 | <0.005 |
| 12% Al | Continuous | 11.8 | 0.880 | 0.020 | 0.008 | 0.003 | 0.0003 | <0.005 |
| 12% Al | Continuous | 11.8 | 0.870 | 0.022 | 0.009 | 0.004 | 0.0004 | <0.005 |

Some of the physical properties of the 2% and 4% aluminum targets were measured (at 21° C.) and the results are set forth in Table 3.

TABLE 3

| | Continuous Cast (4% Al) | Continuous Cast (2% Al) | Gravity Cast (2% Al) |
|---|---|---|---|
| Tensile Strength (psi) | 39,100 | 33,700 | 23,600 |
| Yield Strength (psi) | 30,600 | 27,000 | 23,000 |
| Elongation (%) | 1.2 | 1.8 | 0.4 |
| Hardness (HB) | | | |
| 250/5/30 | 88.3 | 92.0 | 82.3 |
| 20/2/30 | 85.3 | 88.2 | 82.9 |
| Density | | | |
| g/cc @ 21° C. | 6.60* | 6.91 | 6.87 |
| lb/in³ @ 70° F. | 0.240* | 0.250 | 0.248 |
| Thermal Expansion | | | |
| μ m/m/°C. | 27.4* | 27.4 | 29.2 |
| μ in/in/°F. | 15.2* | 15.2 | 16.2 |

*These values were taken from International Lead Zinc Research Organization "Engineering Properties of Zinc Alloys" - 3rd Edition, ILZRO, Research Triangle Park, North Carolina, August 1988, page 12.

Figure 10:
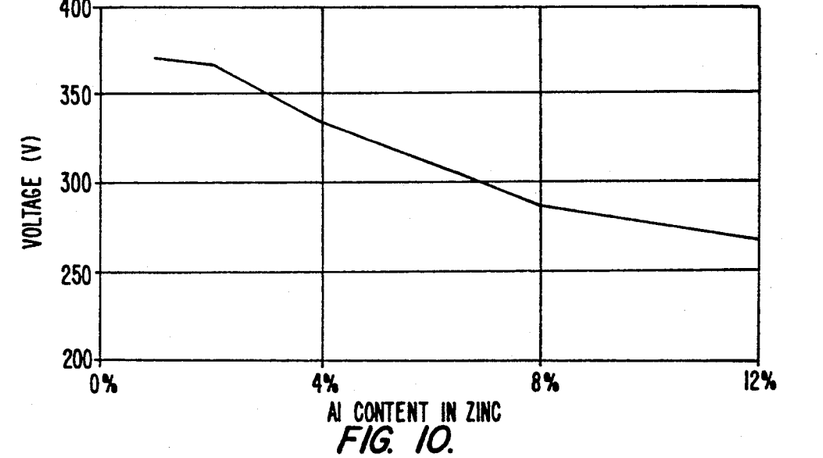
FIG. 10 is graph of voltage versus aluminum content.
Figure 11:
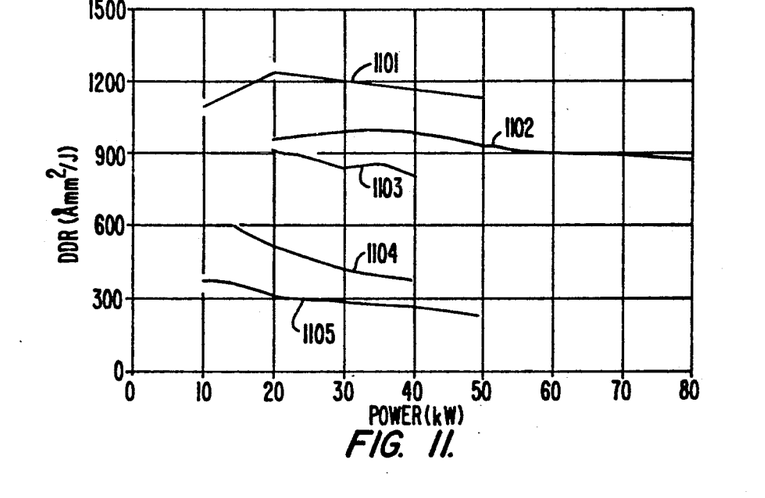
FIG. 11 is graph of zinc oxide DDR of various targets versus power.

As is apparent, the 2% target manufactured by the continuous casting method exhibits better tensile and yield strength which is important for self-supporting targets. It is believed that the faster cooling associated with the continuous casting process results in an alloy with finer grains. The 2% aluminum target is a preferred embodiment of the inventive self-supporting target. This is a compromise between mechanical strength and operating characteristics. The target operating voltage and deposition rate are highest for pure, zinc, and fall off rapidly as the aluminum content is increased. This is shown graphically in FIGS. 10 (voltage versus Al content) and 11 (zinc oxide DDR of various targets versus power). In FIG. 11, curves 1101, 1102, 1103, 1104, and 1105, represent deposition rates for 1%, 2%, 4%, 8%, and 12% aluminum targets, respectively. Given that zinc targets containing approximately 1% aluminum or less have insufficient strength to be self-supporting, the 2% aluminum alloy provides self-supporting targets that have the highest deposition rate and operating voltage.

Microstructure Examination

Metallographic specimens were prepared with small sliced sections of the cast materials in the ascast condition. The zinc alloy specimen surfaces underwent a sequence of wet-grinding with 240, 400 and 600 grit paper. Final surface polishing was carried out on a polishing wheel using 2.5 micron diamond paste.

Figure 12:
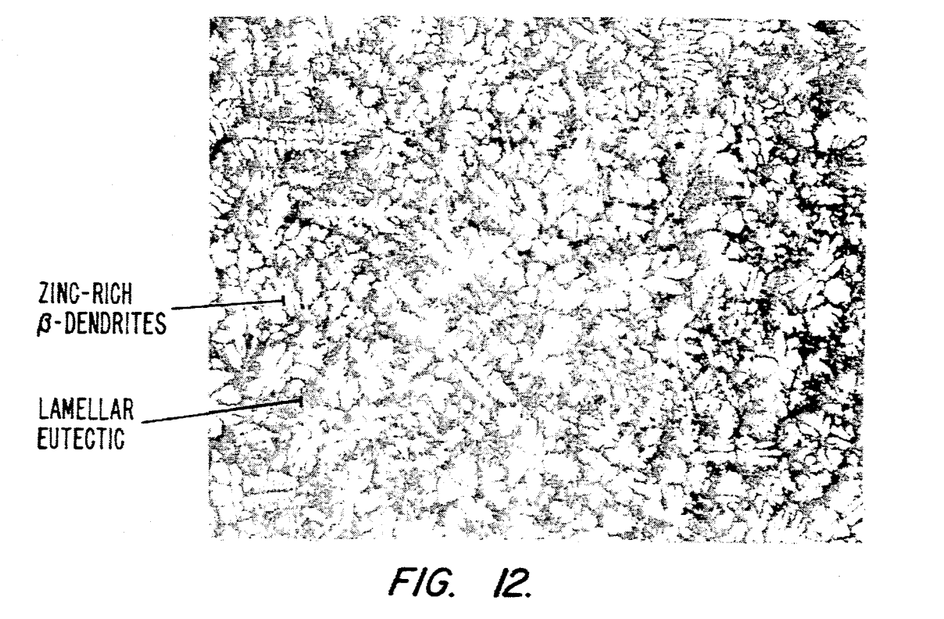
FIG. 12 is a photomicrograph of the microstructure of a zinc-aluminum alloy.
Figure 13:
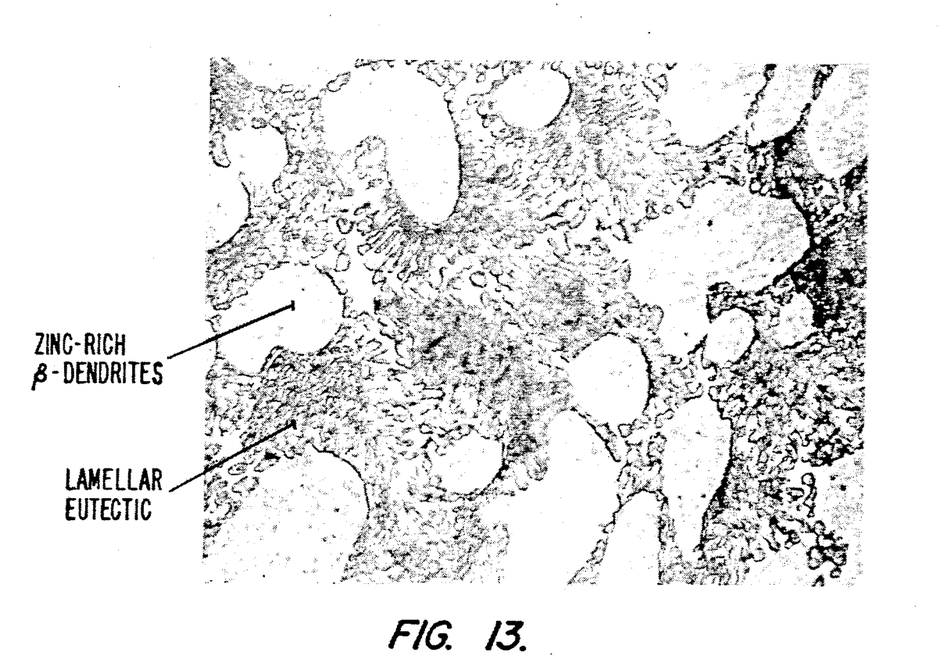
FIG. 13 is a photomicrograph of the microstructure of a zinc-aluminum alloy.
Figure 14:
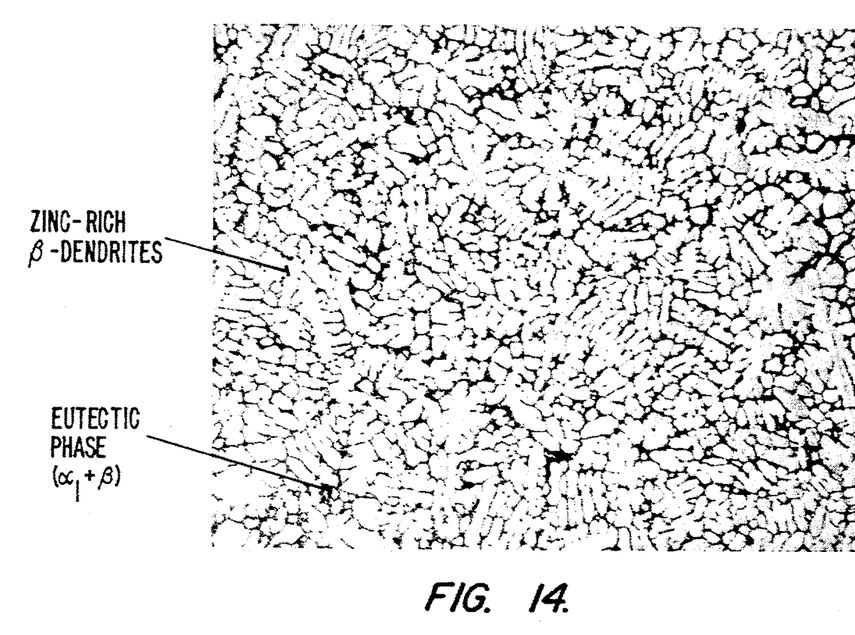
FIG. 14 is a photomicrograph of the microstructure of a zinc-aluminum alloy.
Figure 15:
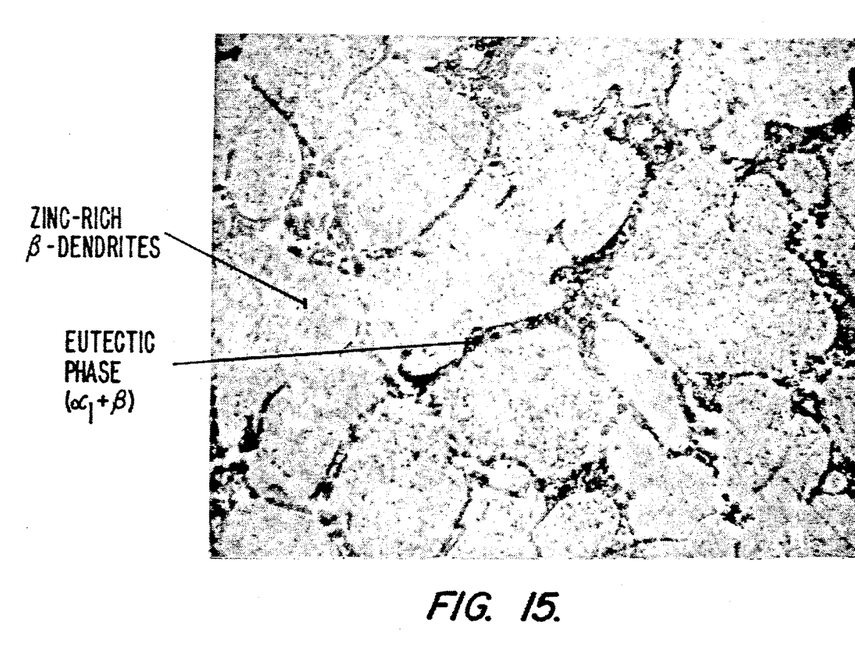
FIG. 15 is a photomicrograph of the microstructure of a zinc-aluminum alloy.
Figure 16:
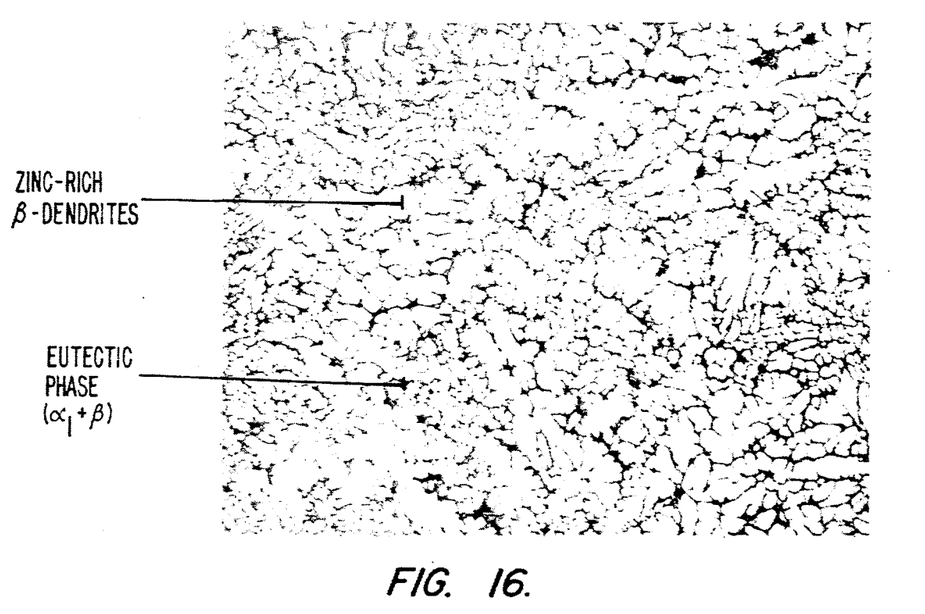
FIG. 16 is a photomicrograph of the microstructure of a zinc-aluminum alloy.
Figure 17:
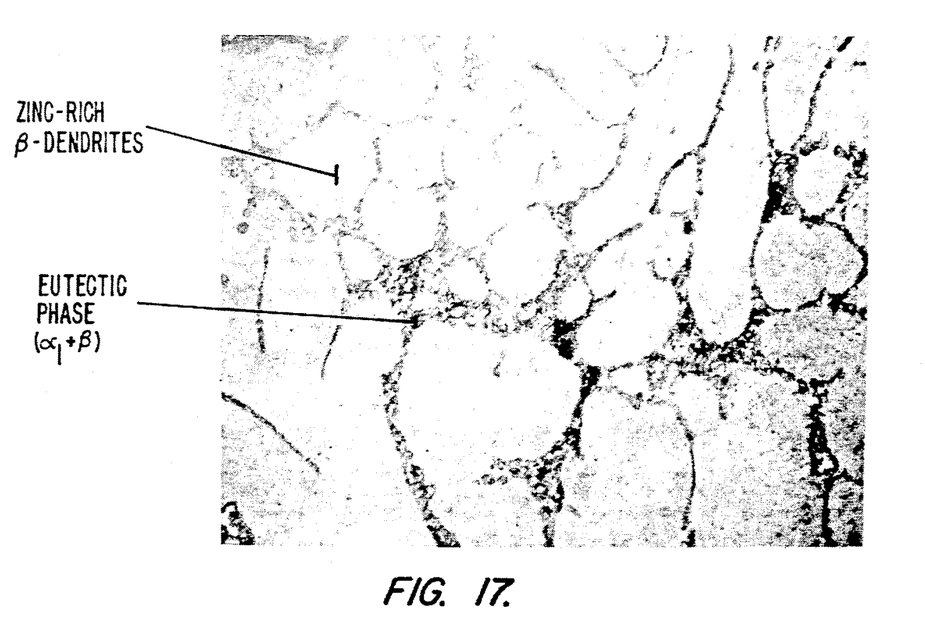
FIG. 17 is a photomicrograph of the microstructure of a zinc-aluminum alloy.

The specimens were cleaned with alcohol and etched with nitric acid diluted with alcohol (NITAL). The microstructures were examined under a NIKON binocular microscope at 100 and 1000 times magnification. Photomicrographs were taken with the Polaroid camera attachment. FIGS. 12 and 13 are photomicrographs of the microstructure for the 4% Al alloy (continuous cast) at ×100 and ×1000, respectively; FIGS. 14 and 15 are photomicrographs of the microstructure for the 2% Al alloy (continuous cast) at ×100 and ×1000, respectively; and FIGS. 16 and 17 are photomicrographs of the microstructure for the 2% Al alloy (gravity cast) at ×100 and ×1000, respectively. The different phase structures are noted in the photomicrographs.

Figure 18:
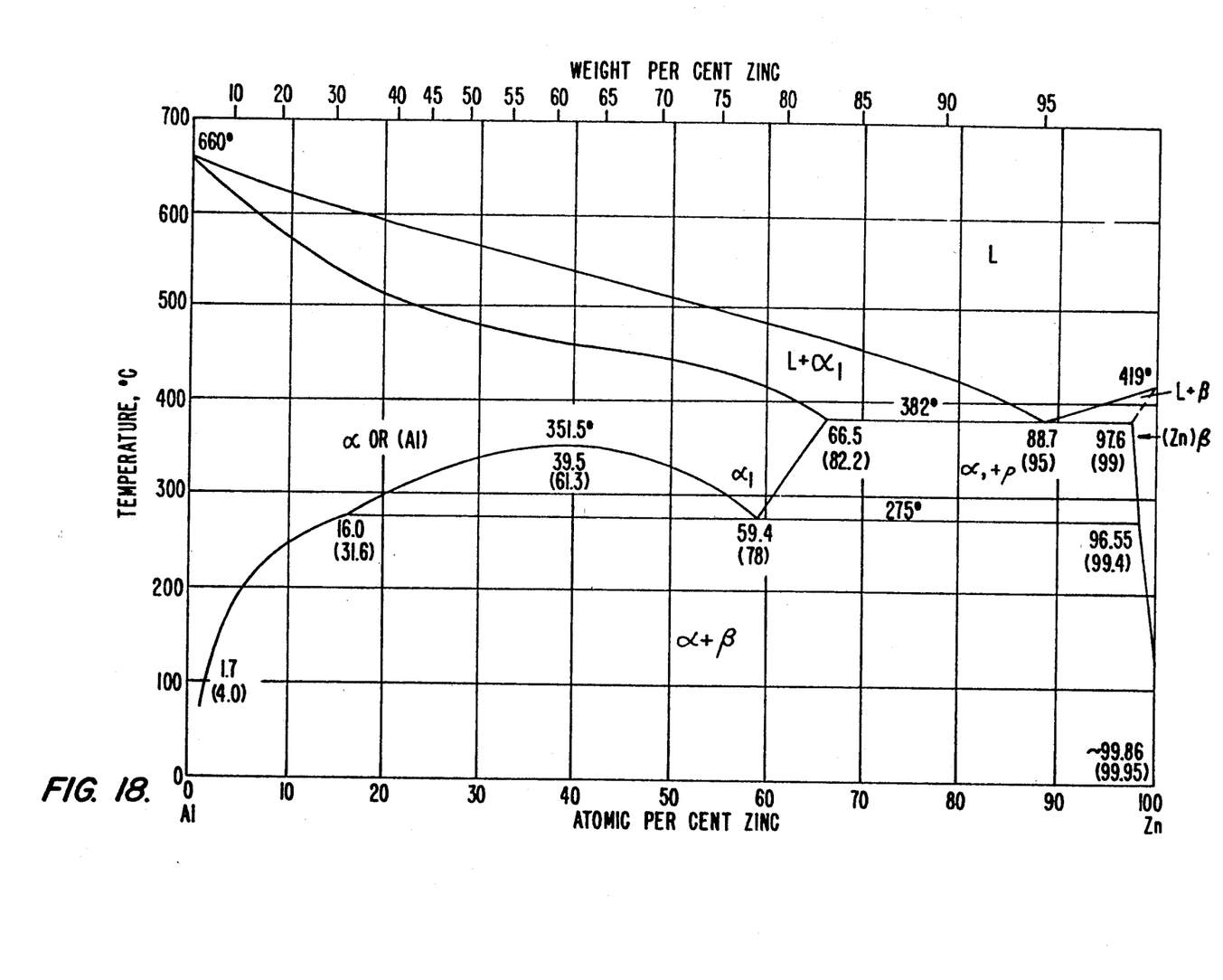
FIG. 18 is a zinc-aluminum phase diagram.

Since the 4% Al alloy and 2% Al alloy are basically zinc-aluminum alloys with small amounts of additional Cu and Mg, their microstructures can be discussed on the basis of the binary zinc-aluminum phase diagram shown in FIG. 18, which was taken from Hansen and Anderko, "Constitution of Binary Alloys", 2nd Edition, McGraw-Hill Book Co., N.Y., Aug. 1989, page 149. As solidification of either alloy begins, the primary phase will be the zinc-rich solid ($\beta$) phase freezing as a dendrite in the liquid. When the temperature reaches 382° C., the remaining liquid solidifies as a lamellar eutectic matrix composed of $\beta$-phase and the aluminum-rich $\alpha_1$-phase. As cooling continues and reaches 275° C., the solid $\alpha_1$-phase will decompose by solid reaction (eutectoidally) into a mixture of aluminum-rich $\alpha$-phase and essentially pure zinc ($\beta$-phase). The aluminum-rich phase with some excess zinc in solution, cools to room temperature while the zinc-rich $\beta$-phase continues to precipitate aluminum from solid solution. See Kaye and Street, "Die Casting Metallurgy", Butterworth Scientific, London, Great Britain, 1982, pages 86-88.

Although the various features of the present invention have been described with respect to preferred embodiments thereof, it will be understood that the invention is entitled to protection within the full scope of the appended claims.

It is claimed:

1. A method of depositing a thin film of a zinc based compound onto a substrate, comprising the steps of:
   positioning a cathode into an evacuable coating chamber, wherein said cathode comprises a self-supporting cylindrical target tube having a magnet assembly inside and wherein the target is made of an alloy comprising greater than 1 but less than approximately 7% aluminum and the remainder zinc, with all percentages by weight;
   placing the substrate into said chamber;
   rotating the target about its longitudinal axis; and
   sputtering the target in a reactive atmosphere thereby depositing the zinc based compound film onto a surface of said substrate.

2. A method of depositing a thin film of a zinc based compound onto a substrate, comprising the steps of:
   positioning a cathode into an evacuable coating chamber, wherein said cathode comprises a self-supporting cylindrical target tube having a magnet assembly inside and wherein the target is made of an alloy comprising approximately 2% aluminum and the remainder zinc, with all percentages by weight;

placing the substrate into said chamber;

rotating the target about its longitudinal axis; and sputtering the target in a reactive atmosphere thereby depositing the zinc based compound film onto a surface of said substrate.

3. A method of depositing onto a substrate a metal film comprising the steps of:

positioning a cathode into an evacuable coating chamber, wherein said cathode comprises a self-supporting cylindrical target tube having a magnet assembly inside and wherein the target is made of an alloy comprising greater than 1 but less than approximately 7% aluminum and the remainder zinc, with all percentages by weight;

placing the substrate into said chamber;

rotating the target about its longitudinal axis; and sputtering the target thereby depositing the metal film onto a surface of said substrate.

4. A method of depositing onto a substrate a metal film comprising the steps of:

positioning a cathode into an evacuable coating chamber, wherein said cathode comprises a self-supporting cylindrical target tube having a magnet assembly inside and wherein the target is made of an alloy comprising approximately 2% aluminum and the remainder zinc, with all percentages by weight;

placing the substrate into said chamber;

rotating the target about its longitudinal axis; and sputtering the target thereby depositing the metal film onto a surface of said substrate.

5. A method of depositing a zinc based compound film onto a substrate, comprising the steps of:

positioning a cathode into an evacuable coating chamber, wherein said cathode comprises a self-supporting cylindrical target tube having a magnet assembly inside and wherein the target is made of an alloy formed of zinc and sufficient amounts of a grain refiner added during solidification of the alloy so that predominantly only one phase of the alloy is present after solidification;

placing the substrate into said chamber;

rotating the target about its longitudinal axis; and sputtering the target in a reactive atmosphere thereby depositing the zinc based compound film onto a surface of said substrate.

6. A method of depositing a zinc based compound film onto a substrate, as defined in claim 5 wherein the step of sputtering the target comprises sputtering the target in an oxygen gas atmosphere, whereby a thin film of zinc oxide is deposited on the substrate.

7. A method of depositing a zinc based compound film onto a substrate, comprising the steps of:

positioning a cathode into an evacuable coating chamber, wherein said cathode comprises a self-supporting cylindrical target tube having a magnet assembly inside and wherein the target is made of an alloy of greater than 1% but less than approximately 7% of one or more elements selected from the group consisting of aluminum, titanium, vanadium, tantalum, and zirconium, and the reminder is zinc, with all percentages by weight;

placing the substrate into said chamber;

rotating the target about its longitudinal axis; and sputtering the target in a reactive atmosphere thereby depositing the zinc based compound film onto a surface of said substrate.

8. A method of depositing a zinc based compound film onto a substrate as defined in claim 7 wherein the step of sputtering the target comprises sputtering the target in an oxygen gas atmosphere, whereby a thin film of zinc oxide is deposited on the substrate.

9. A method of depositing a zinc based compound film onto a substrate, comprising the steps of:

positioning a cathode into an evacuable coating chamber, wherein said cathode comprises a self-supporting cylindrical target tube having a magnet assembly inside and wherein the target is made of an alloy comprising greater than 1 but less than approximately 7% of one or more elements selected from the group consisting of bismuth, cerium, gadolinium, hafnium, niobium, silicon, and yttrium, and the remainder is zinc, with all percentages by weight;

placing the substrate into said chamber;

rotating the target about its longitudinal axis; and sputtering the target in a reactive atmosphere thereby depositing the zinc based compound film onto a surface of said substrate.

10. A method of depositing a zinc based compound film onto a substrate as defined in claim 9 wherein the step of sputtering the target comprises sputtering the target in an oxygen gas atmosphere, whereby a thin film of zinc oxide is deposited on the substrate.

11. A method of depositing a zinc based compound film onto a substrate, comprising the steps of:

positioning a cathode into an evacuable coating chamber, wherein said cathode comprises a self-supporting cylindrical target tube having a magnet assembly inside and wherein the target is made of an alloy comprising greater than 1 but less than approximately 7% of one or more elements selected from the group consisting of aluminum, bismuth, cerium, gadolinium, hafnium, niobium, silicon, tantalum, titanium, vanadium, yttrium, and zirconium, and the remainder is zinc, with all percentages by weight;

placing the substrate into said chamber;

rotating the target about its longitudinal axis; and sputtering the target in a reactive atmosphere comprising of oxygen thereby depositing the zinc based compound film onto a surface of said substrate.

12. A method of depositing a zinc based compound film onto a substrate as defined in claim 11 wherein the step of sputtering the target comprises sputtering the target in an oxygen gas atmosphere, whereby a thin film of zinc oxide is deposited on the substrate.

13. The method of depositing a film as defined in either claim 1, 2, 3, 4, 5, 7, 9, 11, 6, 8, 10, or 12 wherein the step of positioning said cathode into an evacuable coating chamber comprises providing a target tube made of a zinc-based alloy comprising copper and magnesium, which together constitute less than or equal to approximately 1% of said alloy.

14. The method of depositing a film as defined in either claim 1, 2, 3, 4, 5, 7, 9, 11, 6, 8, 10, or 12 wherein the step of positioning said cathode into an evacuable coating chamber comprises mounting the target horizontally in the coating chamber.

* * * * *